United States Patent [19]
Weber

[11] 4,438,501
[45] Mar. 20, 1984

[54] ANTILATCHUP PSEUDORANDOM BINARY SEQUENCE GENERATOR

[76] Inventor: Harold J. Weber, 20 Whitney Dr., Sherborn, Mass. 01770

[21] Appl. No.: 348,844

[22] Filed: Feb. 16, 1982

[51] Int. Cl.³ .......................... H03K 3/84; H03B 29/00
[52] U.S. Cl. .................................................. 364/717
[58] Field of Search ........................... 364/717; 331/78

[56] References Cited
U.S. PATENT DOCUMENTS

| | | | |
|---|---|---|---|
| 3,609,327 | 9/1971 | Paine et al. | 364/717 |
| 3,681,708 | 8/1972 | Olmstead | 331/78 |
| 4,213,101 | 7/1980 | Policand et al. | 331/78 |
| 4,291,386 | 9/1981 | Bass | 364/717 |
| 4,348,597 | 9/1982 | Weber | 331/78 |

Primary Examiner—David H. Malzahn

[57] ABSTRACT

An antilatchup pseudorandom binary sequence generator which is interruptable without loss of sequence integrity. Provides sequence detector responsive to correct any undesirable sequence of substantially constant disallowed binary states. Properly irregular sequence may be repeatedly stopped and restarted, with the restarted pattern commencing substantially in the irregular sequence as though no interrupt had taken place. Single stepping, time independent binary sequence generation including the antilatchup improvement is provided.

11 Claims, 9 Drawing Figures

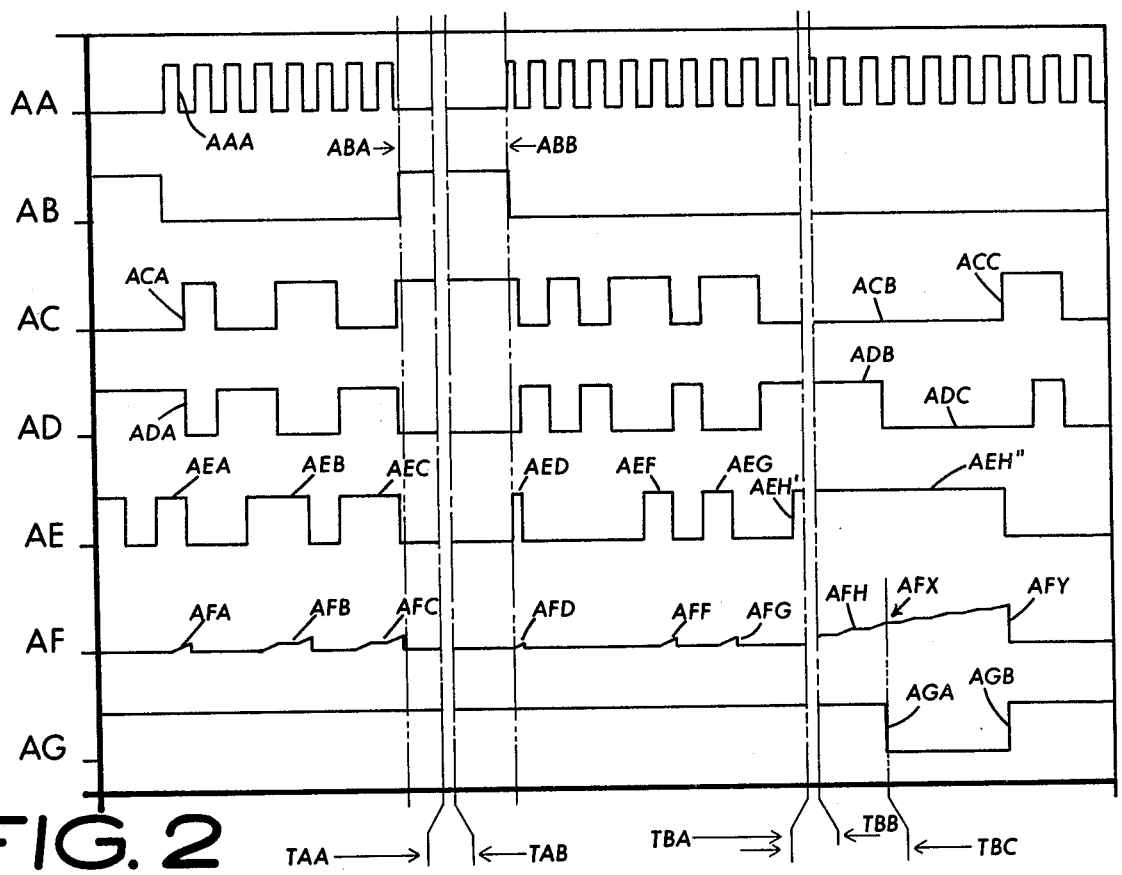
FIG. 2
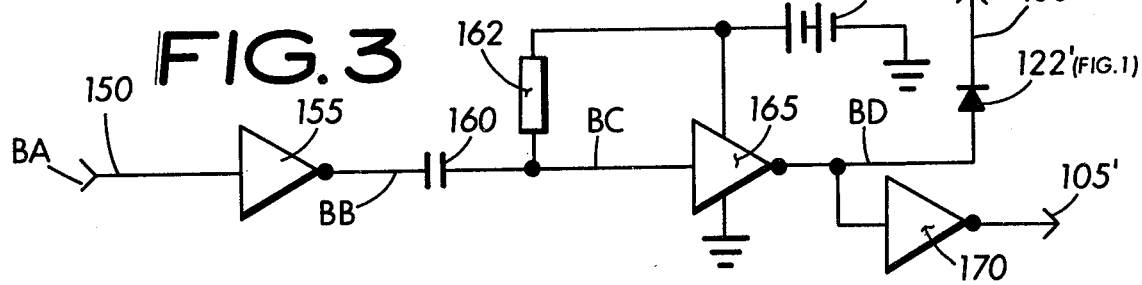
FIG. 3
FIG. 4

ANTILATCHUP PSEUDORANDOM BINARY SEQUENCE GENERATOR

SUMMARY

An antilatchup pseudorandom binary sequence generator which may be interrupted at any point in the sequence without loss of overall sequence pattern when interruption is removed and the sequence continues. A sequence detector is provided which acts to correct any binary pattern which assumes a continuum of disallowed states. The detector serves to at least momentarily change the operative feedback logic sense around a shift register sequential element between that of effectively EXCLUSIVE-OR and that of effectively EXCLUSIVE-NOR. This serves to enter at least one bit into the register of a sense opposite that of the disallowed state sense. This so-entered bit shifts through the register, acting with the combinatorial logic to effect correction of the disallowed latchup mode states.

Therefore what my invention shows is a pseudorandom generator which may be interrupted at any point in the sequence without loss of overall sequence pattern.

I further show that the interrupted generator may re-start with the overall pattern continuing as though no interrupt had occurred.

What is depicted is a detector element which responds to a shifted through sequence of disallowed states, producing a signal therefrom which is effective to change the feedback sense through the combinatorial logic so as to enter at least one binary state into the register input of an opposite sense to that of the disallowed state.

What is further shown is how a shift register in combination with EXCLUSIVE-OR logic, a selectable INVERT function, and a disallowed state detector may serve to correct any latchup status produced by the generator.

Still further taught is the synchronization of the control input signal which serves to DISABLE, or interrupt the generator with the CLOCK transistions so as to prevent the introduction of extraneous advance of the shift register.

Yet another improvement is brought out as a shift register, recirculation feedback logic, and disallowed state detector which combine to provide a pseudorandom binary sequence generator having a wide dynamic clocking rate range, which is interruptable without sequence upset, and which is wholly implemented through dynamic elements of gates and flip-flops and may therefore comprise a singular monolithic circuit.

Still another form teaches a pseudorandom sequence generator which may be clocked at a very slow, even irregular, one step at a time rate while still retaining full antilatchup performance and sequence continuation after interrupt.

Shown also is a useful embodiment of the invention that couples with a thyristor power switch, that together with an ordinary incandescent electric lamp, serves to cause irregular fluctuation of the power coupled with the lamp and thereby bring about the illusion of a flickering natural flame.

Provided for is an antilatchup, interruptable, variable, wide dynamic range clocked pseudorandom binary sequence generator and lamp controller having the capability for being manufactured in an embodiment having long sequence lengths and at low cost.

DESCRIPTION OF DRAWINGS

FIG. 2 Waveforms showing signal conditions typical for embodiment of FIG. 1.

FIG. 3 Slow or varying clock pulse waveform normalizing circuit.

FIG. 4 Waveforms showing signal conditions typical for embodiment of FIG. 3.

DESCRIPTION

Figure 1:
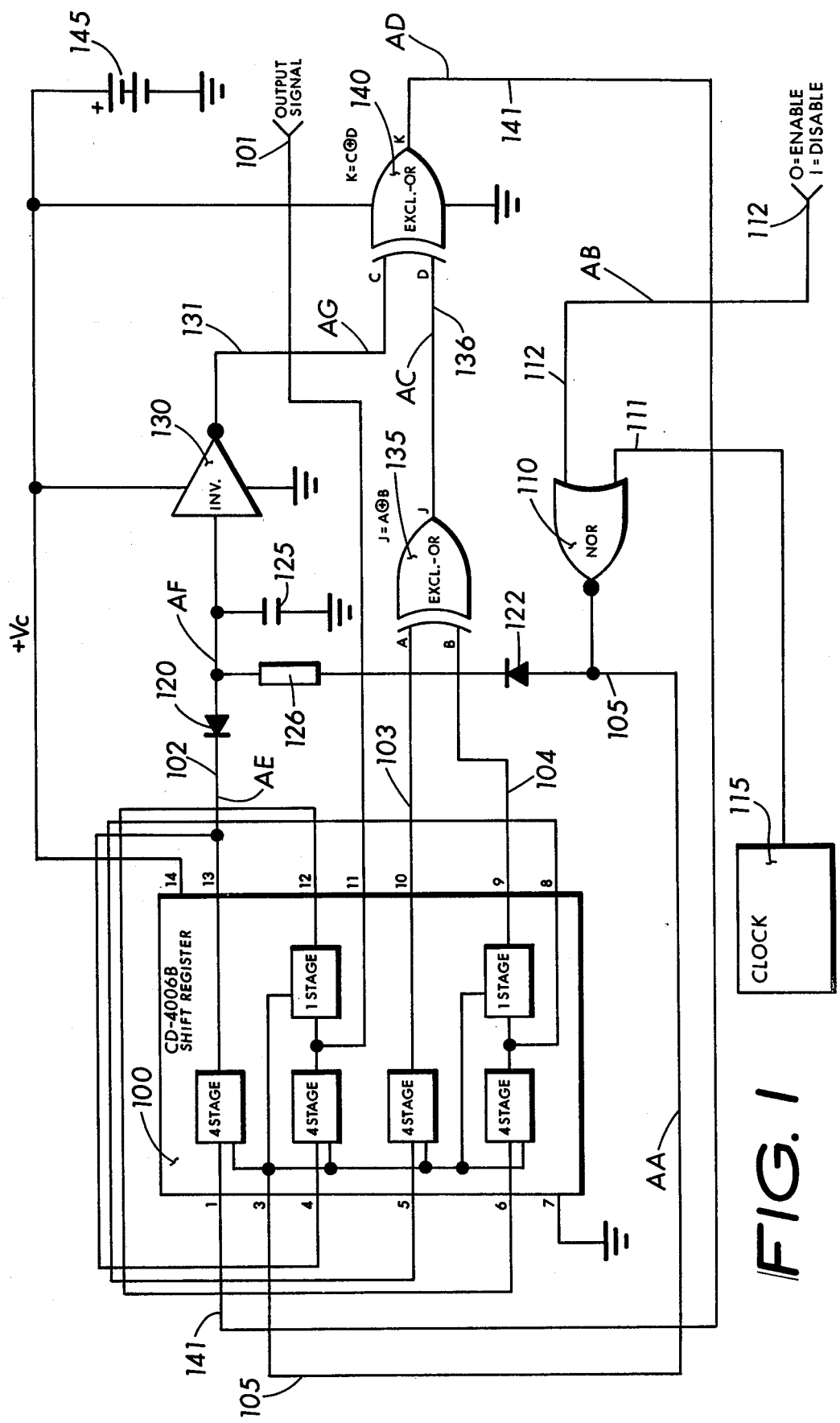
FIG. 1 Shows a seventeen stage pseudorandom generator including DISABLE control input and antilatchup detector.

An antilatchup pseudorandom binary sequence generator is depicted in FIG. 1 using a C-MOS type CD-4006B 18-stage shift register 100. The register is hooked up in known form, with the 14th stage 103 and the 17th stage 104 outputs coupled to the A and B inputs of an EXCLUSIVE-OR logic function gate 135. The J output couples 136 to yet another EXCLUSIVE-OR gate 140 which operates as a selectable inverter: e.g., when the C input is LOW the K output will be a replica of the D input signal, whilst if the C input is HIGH the K output will be an INVERTED replica of the D input signal. This K signal 141 couples back to the DATA input (pin 1) on the register 100.

In prior art hookups, such direct connection is not allowable since the register 100 may reach a state of all HIGHS and effectively latch up. Therefore in these prior circuits a condensor is hooked in series with the data line 141, with a pull-up resistor connected between the data input pin 1 and $+V_c$. Such an arrangement is well taught in the publication "C-MOS Cookbook" by Don Lancaster, Howard Sams & Co. Publisher, Library of Congress Card 76-42874, on pages 320 and 321.

The shortcoming of the prior art is that a clock signal input rate $F_{ck}$ must always occur which is at least about equal to $$F_{ck} = \frac{n}{t_{RC}}$$

where:
n = number of shift register stages
$t_{RC}$ = time constant of the resistor and condensor in the data line.

If this is not satisfied: for example should the clock rate slow or stop altogether, the shift register will shift through a string of all HIGH levels for EXCLUSIVE-OR gating action which is at least as long as the register length n. The pseudorandom character of the overall signal will be lost. More importantly, it is not possible to inhibit and again restart the sequence where it left off.

In this new teaching, where direct coupling is used, a separate output 102 is picked off one of the earliest stages of the register 100. With the CD4006B, 4 stages is the earliest accessible point, on pin 13. Whenever line 102 goes LOW diode 120 conducts so as to discharge any energy in condensor 125, holding the input of inverter 130 (such as a C-MOS CD4069B) logic LOW. The inverter output 131 will then go HIGH, pulling the input C of gate 140 HIGH and effecting the gate 140 to act as an inverter of any signal on the D input, the overall gating effect being that of EXCLUSIVE-NOR.

The clocking of the register 100 is produced by a CLOCK source 115 coupled 111 to a NOR gate 110, which when the other input 112 is LOW acts to replicate clock pulses on line 105.

In the event the register becomes loaded in a disallowed state with all HIGH levels, the output 102 will appear to remain high as the register recirculates. This acts to back bias diode 120. The result in condensor 125 accumulates a charge through resistor 126 together with diode 122 on the HIGH clock transistions. When the condensor charge accumulates sufficiently, the resulting HIGH level on the input of inverter 130 will cause line 131 to go logic LOW on the C input of the gate 140, causing the overall gating effect to revert to EXCLUSIVE-OR, or a non-inverting gate function state for the D input signal. The result is the data on line 105 will momentarily reverse for at least four clock pulse periods, until line 102 again goes LOW draining off the charge on condensor 125 through discharge diode 120.

In the event the DISABLE state HIGH appears on input 112 of gate 110, the gate output 105 will switch LOW for as long as the DISABLE state remains. Condensor 125 receives no charge through resistor 126, and the circuit is fooled into retaining its state modes throughout the register 100. Although the transistion to DISABLE may introduce the effect of one extra clock pulse into register 100, due to the negative edge triggering of the register upon disablement, this is usually of little import or else may be alleviated by introducing an extra inverter function in series with line 105 to the register pin 3 input.

For reliable operation, the time constant of the resistor 126 and condensor 125 should be at least:

$$t_{RC} = n\left(\frac{1}{F_{ck}}\right)$$

which should be no problem for a continuously running clock $F_{ck}$. The result of the FIG. 1 combination is a pseudorandom sequence generator which may be DISABLED by a control signal 112 at any point in a pulse train sequence, and then again ENABLED by the control signal in such a way that the sequence continues in the same pattern as though no DISABLE interruption had taken place. A serial pseudorandom sequence OUTPUT SIGNAL appears on the register pin 11, at output 101: a similar sequence is of course available at any of several other register outputs, as well as at the outputs of gate 135 or 140.

Waveform representations in FIG. 2 show the circuit action of FIG. 1. The usual clock signal appears on the input 111 of NOR gate 110. The ENABLE/DISABLE control signal AB couples to the other NOR input 112. The result is a train of clock pulses AA occurs on the clock line 105 when the control signal 112 is LOW.

These clock pulses 105 couple to the register 100, serving therewith to advance the register through a predeterminate pseudorandom sequence, producing several outputs therefrom on pins 8 through 13. The outputs appearing on pins 9 and 10 couple to the A and B inputs 103, 104 of an EXCLUSIVE-OR gate 135 producing an output J signal AC on line 136. This signal couples to an EXCLUSIVE-OR gate 140, together with a usually HIGH signal AG on line 131. With the C input HIGH gate 140 acts as an inverter for any signal on the D input. This produces an inverted replicate signal AD on the output K line 141. The AB waveform is also shown to DISABLE the generator, resulting in a stop of the clock pulse AA flow during the period ABA through ABB, which may be equivalent to time TAA through TAB: any desired time. It is seen that the last remaining state of outputs AC, AD, and AE are retained during this period and when the disablement period terminates ABB, the register outputs resume the same sequence as if no disablement had taken place. The AE waveforms serve to back-bias the discharge diode 120. The result is a charging of condensor 125 as depicted by waveform AF, which shows the charging action to occur only when the clock signal AA is HIGH. During a time interval TBA to TBB, the register tries to latchup, that is all HIGH levels (a disallowed sequence) appear on the AC line during pulse ACB. The AF charge builds up until point AFX is reached, whereupon the C-MOS inverter 130 transitions, producing a reversal of the AG signal to a LOW state. The resulting effect is gate 140 will become non-inverting, changing the sign of the AD signal from the ADB to the ADC value. This feeds back into the register and after four clock counts, changes the AEH" state to a LOW value, discharging AFY the condensor 125 and returning signal AG line HIGH AGB. The AC signals will again be inverted by gate 140. The action which has just occurred de-latches the latchup status of the register: effectively serving as anti-latchup protection.

The circuit combination of FIG. 3 when used with the generator of FIG. 1 serves to allow relatively low speed clocking rates without undue oversizing of the condensor 125. The waveforms of FIG. 4 depict the circuit's operation. The inverter 170 output signal BD couples to line 105 in FIG. 1, with NOR gate 110 and the attendant circuits deleted. The low speed clock, say on the order of a few hertz or less, connects to input 150 providing signal BA. The leading (positive) edge of the clock BA appears as a negative transition BBA on the output BB of inverter 155, serving to couple through condensor 160 which together with resistor 162 acts as a differentiator producing signal BC having a waveform decay BCA. This differentiated action produces a short positive pulse BDA on the inverter 165 output which couples through inverter 170 and serves to clock the register 100, while output 166 coupling the HIGH BD signal through diode 122' serves to provide charge current for condensor 125 through resistor 126. With very low hertz clock rates, the value of condensor 125 may be significantly reduced in accord with:

$$t_{RC} = \left(\frac{t_{ck}}{t_{cw}}\right) RC$$

where:

$$t_{ck} = \frac{1}{F_{ck}}$$

$t_{cw} = R_{162} \cdot C_{160}$, e.g. the pulse width of positive pulses BD.

Condensor 125 ought to be a polystyrene or other very low loss dielectric component when $F_{ck}$ is low. As the time $t_{ck}$ lengthens, the leakage of the condensor and the residual leakage of the diodes 120, 122 together with the finite, albeit small, leakage of the C-MOS inverter input 130 may degrade circuit performance.

Figure 5:
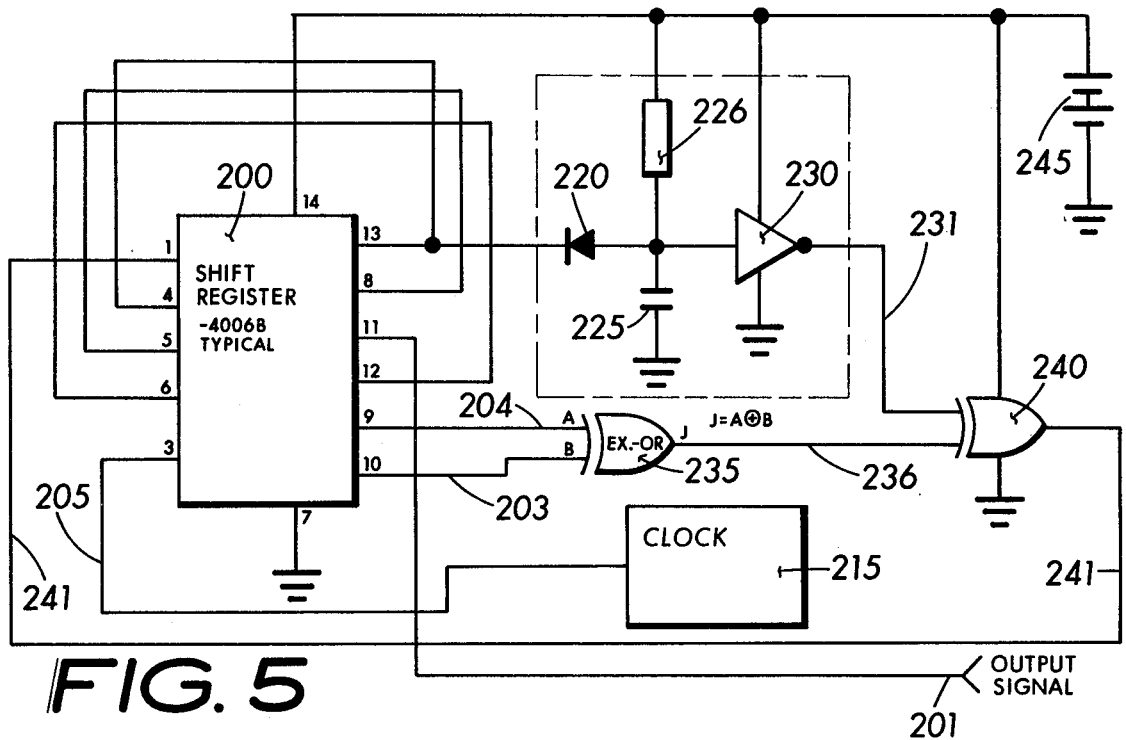
FIG. 5 Form for continuously running generator using fewest parts.

A variation of the new invention appears in FIG. 5, shown in best about minimum component form for a continuously running seventeen stage pseudorandom sequence generator providing about $2^{17}$-1, e.g. 131,071 states for each pseudorandom sequence. This circuit is an adaptation of FIG. 1, with the control input 112 function deleted. The shift register 200 produces outputs 203, 204 which couple through an EXCLUSIVE-OR gate 235 finding feedback to the register pin 1 on line 241 by way of gate 240 which acts as an alterable mode inverter/buffer. Diode 220 keeps condensor 225 substantially discharged as long as some negative pulse levels occur on the register pin 13 for about seventeen clock pulse 241 periods produced by source 215. In the event pin 13 on the register 200 stays HIGH for substantially longer than 17 clock periods, current flow-through resistor 226 charges condensor 225 to a sufficient positive value to cause the output 231 of inverter 230 to switch LOW and reverse the inversion state of gate 240, acting to enter some LOW states into the register and thereby effecting correction of the possible latchup condition.

Figure 6:
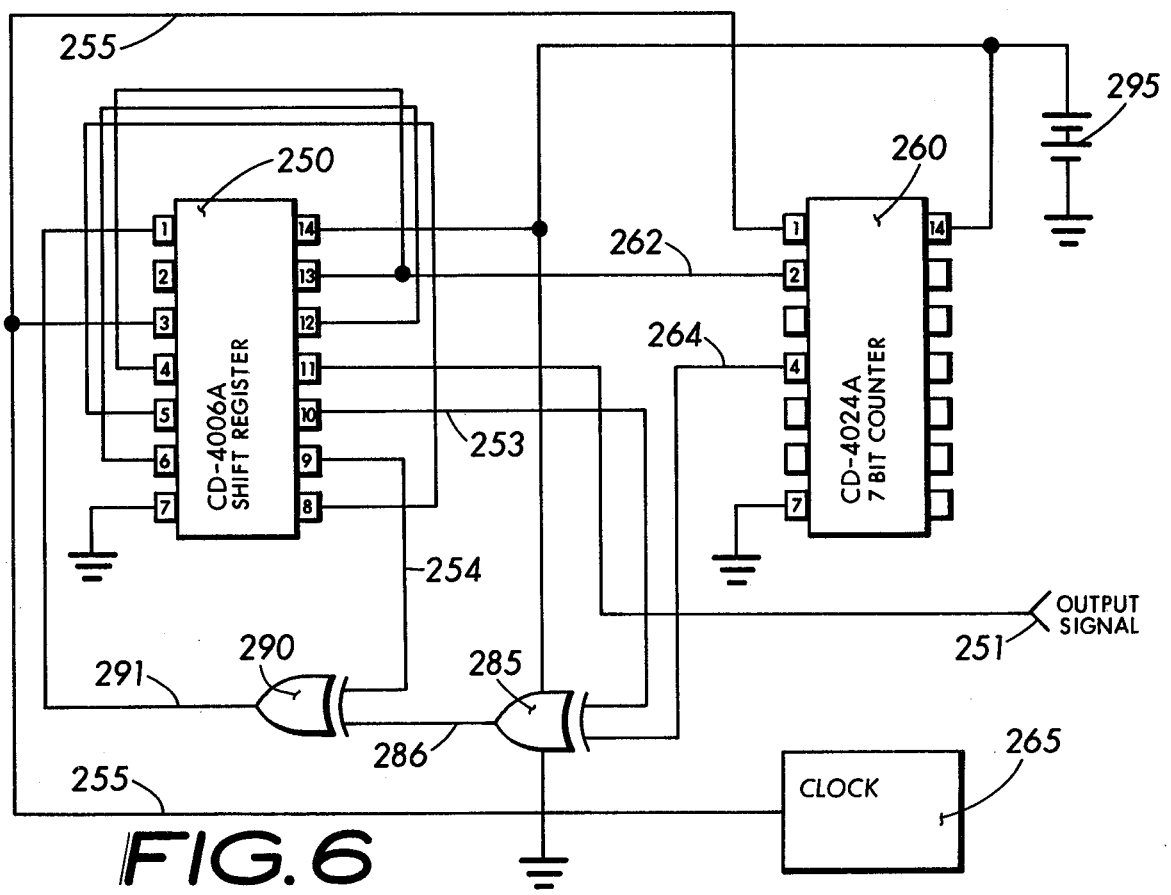
FIG. 6 Extremely slow clock-rate (one step at a time) direct coupled generator having antilatchup detector employing binary counter.

The corrective effect of the "reversing" inverter action produced by the EXCLUSIVE-OR gate 285, which is so very central to the essence of the invention, is shown in FIG. 6 being driven by the $2^6$ output pin 4 of a C-MOS CD-4024B seven stage binary counter 260. The register 250 is clocked 265 on line 255. As the register advances through its pseudorandom states, HIGH state pulses will occur on line 262 from time to time which serves to reset counter 260. If the register 250 should latchup, producing all LOW states during recirculation, the counter reset will not occur and the clock input 255 of the counter will advance the counter states until a HIGH level occurs on output 264 pin 4 which couples to EXCLUSIVE-OR gate 285. The result is the gate will invert, rather than buffer, the LOW state on the register line 253, producing a HIGH state on line 286 and relieving the latchup state produced through gate 290. The counter will be momentarily reset as soon as the new HIGH state on line 291 shifts to the line 262 connection. This circuit configuration is independent of clock rate and provides retention of the last sequence state during clock interruption. Single stepping through a pseudorandom sequence is practical, since no time dependent condensor time constant circuit is included. This combination is also useful for low impedance logic family elements, such as TTL, or DTL type integrated circuits. The only components necessary to implement the "time and invert" effect are active circuit elements, e.g. flip-flops and gates, thereby making for excellent long-term reliability and highly predictable performance even under environmentally severe conditions.

Figure 7:
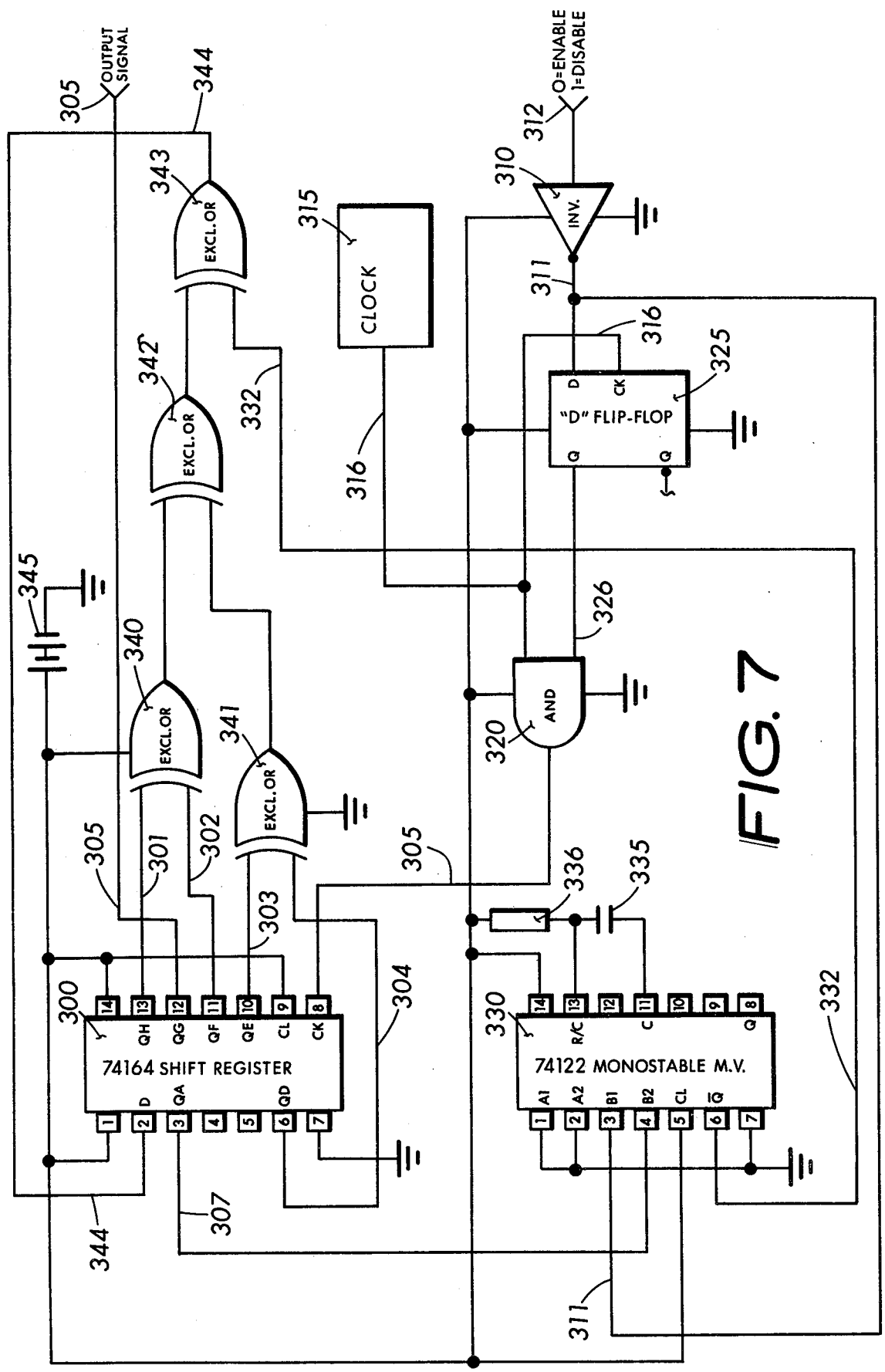
FIG. 7 Monostable multivibrator shown as disallowed state detector providing inverter controlled state correction and clock synchronized interrupt.

Two adjunctive improvements for my teaching appear in FIG. 7. The control line 312 input coupled through inverter 310 is coupled 311 to a "D" flip-flop 325. The result is synchronization of the pseudorandom sequence transistions with the clock, without the glitch phenomenon which is produced by non-synchronous clocking of the register, where a DISABLE control input can serve to immediately advance the register, as in the FIG. 1 hookup. The "D" input of the flip-flop 325 transfers to the input 326 of AND gate 320 only when the positive edge transistion of the clock 315 signal 316 occurs. This output couples to the CK input pin 8 of shift register 300, shown as a 74164 integrated circuit. The outputs 301, 302, 303, 304 couple through EXCLUSIVE-OR gates 340, 341, 342 to produce a feedback data signal at the output of gate 342 coupled to gate 343 operating as a selectable inverter function, the output 344 of which returns to the register "D" input pin 2. The shown combination is particularly suited for relatively low impedance logic family circuits, such as the shown TTL type, or DTL, ECL, etc. In particular the combination is attractive for use cooperatively with the DATA BUS associated with microprocessor functions, such as the ubiquitous type 8080. With low impedance logic, viz current mode logic, the use of RC timing element functions is best performed through the inclusion of a one-shot multivibrator function 330, such as the shown 74122. Repeated reset of the monostable 330 occurs on line 307. In the event that the register should loadup and continue to shift all HIGH states, the one-shot acts to time out $t_w$ in accord with:

$$t_w = 0.32 \, R_{336} \cdot C_{335} \left(1 + \frac{0.7}{R_{336}}\right)$$

$$\text{where: } t_w > n \left(\frac{1}{F_{ck}}\right).$$

The result is the usually clear HIGH state on the Q output pin 6 will switch to a LOW state after the timing cycle, changing the mode of gate 343 from an inverting to a non-inverting function. The signal on line 311 serves to inhibit the one-shot during DISABLE, with the register states being maintained.

The expedient of coupling the generator of FIG. 7 to a microprocessor system may be implemented through the coupling of the eight register outputs QA through QH into a tri-state buffer arrangement, such as the 74125, with the "C" input thereto coupled to the control input 312. The control input 312 is accordingly controlled by the microprocessor decoder instructions, whilst the buffer outputs couple to the common computer oriented DATA BUS.

Figure 8:
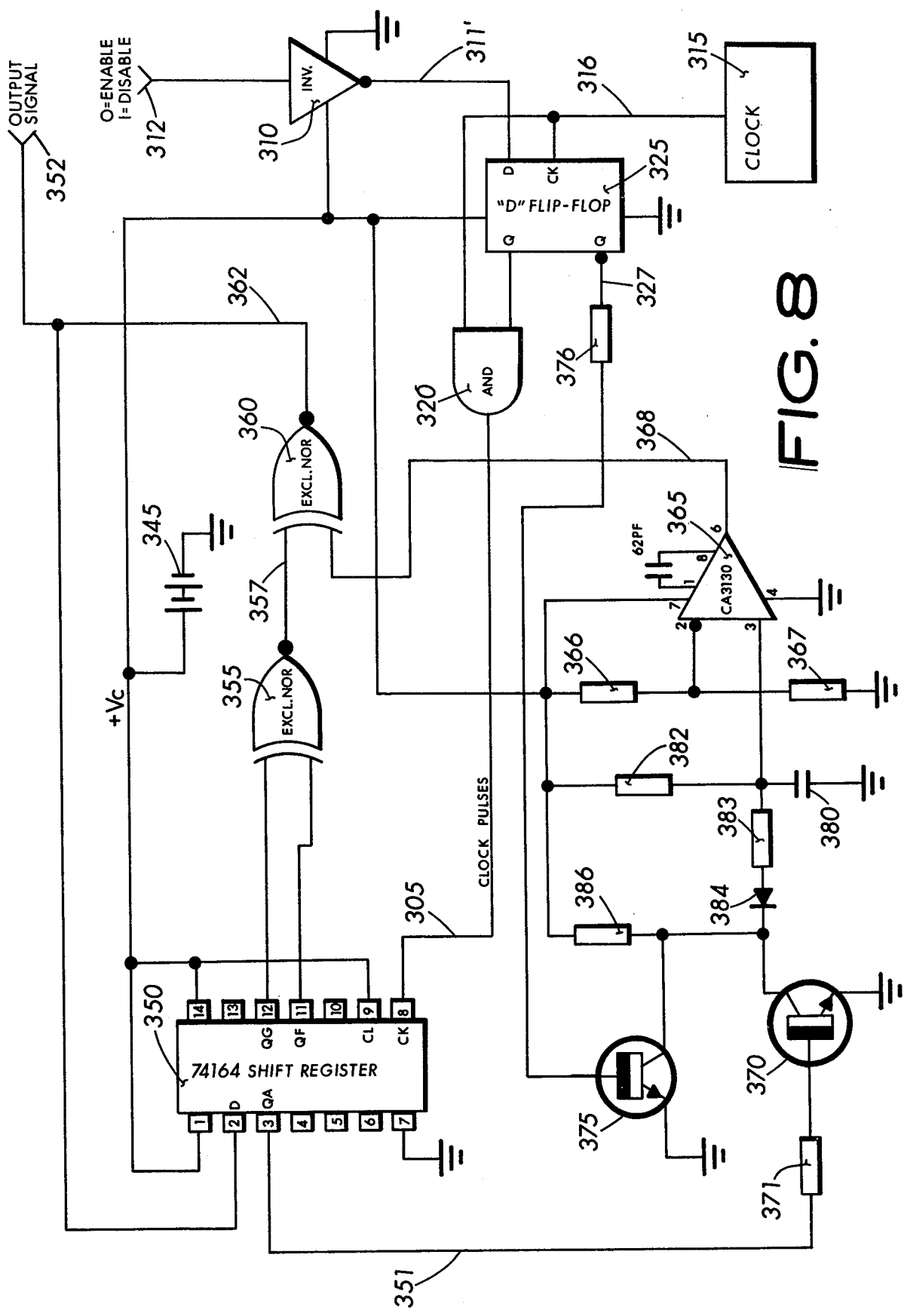
FIG. 8 Condensor discharge elements shown as transistors, combined with C-MOS operational amplifier level detector, and TTL current mode logic.

The use of a transistor discharge element across the accumulator condensor 380 is shown in FIG. 8. Positive sequence pulses on the shift register 350 $Q_A$ output 351 serve to turn transistor 370 "on" by way of base resistor 371. The result is any charge on condensor 380 will be shunted to ground by way of diode 384 in series with resistor 383 (usually about 100 ohms) and the collector of transistor 370. In the event the register 350 fills with disallowed states: all LOW levels, transistor 370 remains biased "off", allowing the collector to pull up to $+V_c$ by resistor 386 which reverse biases diode 384 and allows the condensor to accumulate charge by way of resistor 382. The operational amplifier 365 acts as a voltage level comparator, with the inverting input (pin 2) biased about half the $+V_c$ value by divider resistors 366, 367 which may be about equal value, say 4,700 ohms each. When the condensor charge on the comparator 365 pin 3 rises above (more positive) that on pin 2, the comparator output 368 quickly switches HIGH, causing the EXCLUSIVE-NOR gate 360 to change from the inverting to the non-inverting mode, thereby entering a HIGH level on line 362 into the register "D" input pin 2.

When the newly entered HIGH level shifts to the $Q_A$ output 351, the condensor 380 will again be discharge by transistor 370 and the output 368 of the comparator 365 will again rest LOW inducing gate 360 to act as an inverter. The control input signals 312 and the related circuitry act much as shown for FIG. 7, except the $\overline{Q}$ output 327 of the flip-flop couples through a resistor 376 to a NPN transistor 375, the purpose for which is to keep the condensor 380 discharged so long as the DISABLE input 312 is HIGH, making the line 311' "D" input LOW, resulting in a HIGH on the $\overline{Q}$ output 327. EXCLUSIVE-NOR gate 355 acts with the $Q_F$ and $Q_G$ register outputs to produce a (7 bit-l), e.g. 127 step, pseudorandom sequence on line 357 and in normally inverted form at the output 352.

What FIG. 8 clearly shows is the hybrid combination of TTL logic, a C-MOS comparator, and discrete transistor functions brought together in combination to best accomplish the essence of my teachings.

Figure 9:
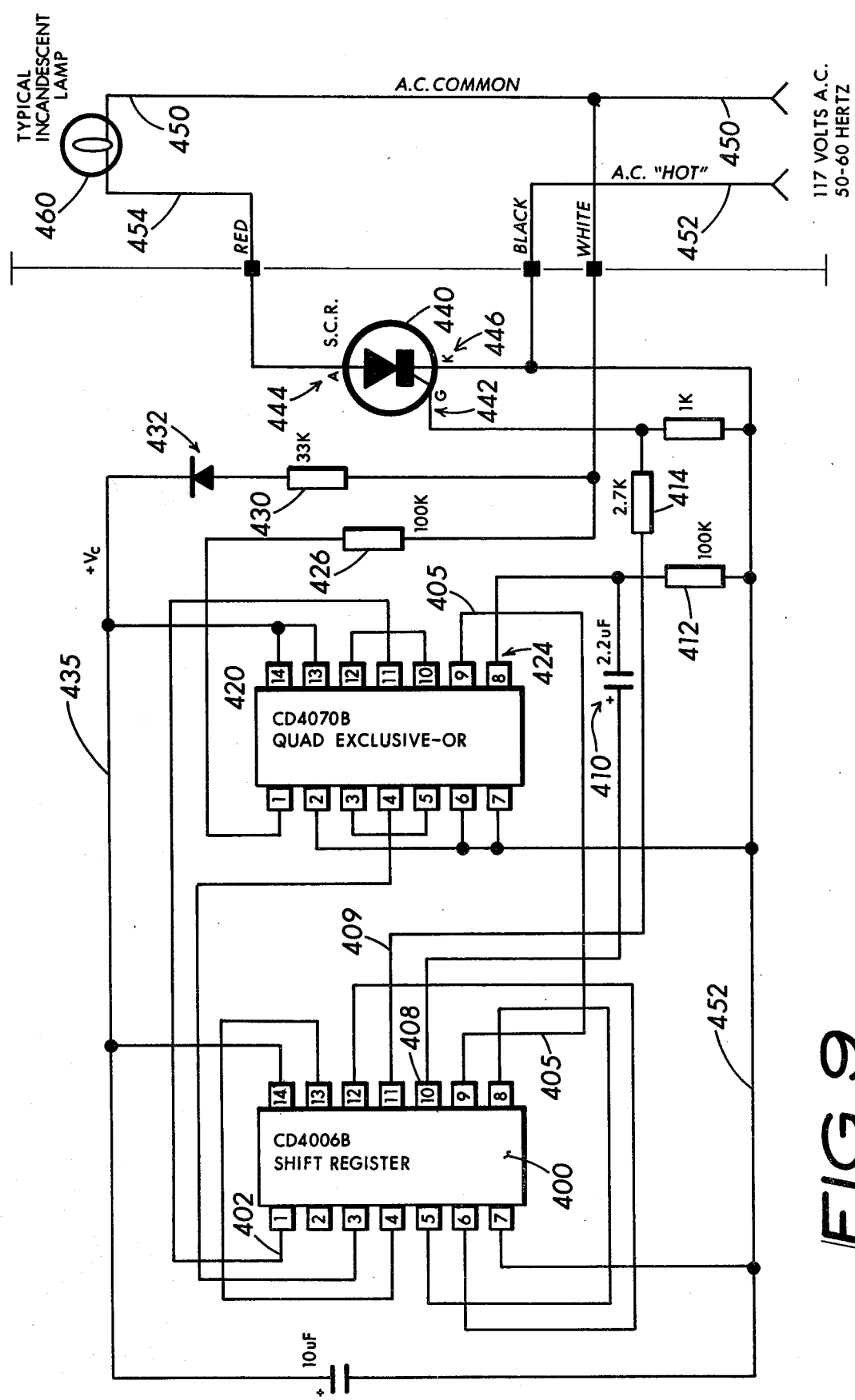
FIG. 9 Pseudorandom generator embodiment is combined with thyristor switch and incandescent lamp to produce a flickering flame lighting effect.

The embodiment of my invention shown in FIG. 9 produces the illusory effect of a flickering, burning flame-like light from an ordinary incandescent electric lamp bulb. In my earlier U.S. Pat. No. 4,253,045 "Flickering Flame Effect Electric Light Controller" an irregularly switched electric lamp is used to produce a flickering effect that is further shown to be controlled by a pseudorandom pulse sequence generator. While the FIG. 3 embodiment of that earlier invention teaches the lamp control using a thyristor switch, it does suffer the undesirable tendency to latch up into a continuum of disallowed control states, albeit but on rare occasion. In a commercial product, such a latchup problem which results in a cessation of flickering and merely a steady light, or no light, is not permissable for it results in consumer complaints and warranty difficulties. Through the adaptation of my novel antilatchup sequence generator to the earlier flicker controller function, the unacceptable latchup problem is overcome without adding to the manufacturing cost of the product.

A shift register 400 is combined with EXCLUSIVE-OR gates 420 to serve as a feedback coupled, clocked source for producing a pseudorandom series of irregular pulses. The feedback signal couples to the register DATA input 402. Register output 405 couples to one EXCLUSIVE-OR gate input, e.g. pin 9, whilst the other gate input, e.g. pin 10, couples by way of a differentiator comprising condensor 410 and resistor 412 to another register output 408. The gate output pin 10 couples with an input, e.g. pin 12, of a second gate whilst the other gate input, e.g. pin 13 is connected HIGH. In the connection shown, the disallowed state mode, viz "latchup", produces all HIGH output pulse states from the shift register. When the pulse train is normal, i.e. irregular, the HIGH and LOW transitions occur frequently enought that condensor 410 does not discharge through resistor 412. When latchup occurs, the steady HIGH state on output 408 allows the charge on the condensor to dissipate through resistor 412, resulting in a LOW signal state on gate input 424. This produces a reversal of the gate inversion sense and an interruption of the register input 402 signal from the disallowed HIGH latchup state to a LOW state until the LOW state is clocked through the register, whereupon proper irregular operation resumes.

The irregular signal on register output line 409 couples through a resistor 414 to the gate input 442 of a silicon controlled rectifier (s.c.r.) 440. Ordinary a.c. power couples on the a.c. common line 450 to a lamp 460, typically a standard 60 or 100 watt light bulb. The other a.c. line 452 couples with the s.c.r. cathode 446, whilst the s.c.r. anode 444 couples with the line 454 connected to the lamp 460. The common return for circuit operation is provided on line 452. Clock pulses are derived from the a.c. signal through resistor 426 connected with cascaded gates integral with the integrated circuit 420. D.c. operating power, on the order of about eight volts between lines 435 and 452 is provided through dropping resistor 430 and rectifier 432. The artisan will clearly see that operation improves over my cited prior art in that controlled, selectable inversion is produced through the gate function depicted by pins 8, 9, 10 of element 420 whenever a disallowed state series persists.

While the invention is shown in several forms, using EXCLUSIVE-OR as well as EXCLUSIVE-NOR logic gate elements, the essence of the invention is found in the reciprocal interchange of the effective gate function between that of an inverting and that of a non-inverting effect thereby serving to correct any hangup of states of all the same disallowed value being recirculated through the associated shift register ad infinitum.

The invention novelty is found in the use of a detector which responds to the effective length of a disallowed sequence which may lead to latchup, with said detector producing a signal which injects into the feedback gate function loop so as to momentarily upset the feedback sense and thereby correct the latchup inducing sequence.

Additional novelty is found in the ability to DISABLE the pseudorandom signal in the midst of a sequence and then to be ENABLED to resume the sequence without a change in the pseudorandom sequence character over what it would have been if no disablement had taken place.

A still further advantage resides in the ability to receive INTERRUPT, ENABLE, DISABLE or other such control signals from a computer or microprocessor based system and to co-act with the instructions without losing the natural pseudorandom sequence character of the generator.

What I claim is:

1. Antilatchup pseudorandom binary sequence generator means providing an irregular continuum of binary states whereby said generator includes at least:
    a. source of effective clock signal;
    b. binary shift register means including a clock input thereto coupled with said source, having at least one data signal input and plural effectively paralleled outputs;
    c. combinatorial logic gate means having at least two inputs coupled to said register plural outputs to combine the said register outputs into an effectively irregular binary feedback signal;
    d. selectable inverter means, effectively including a control input and a signal input coupled with said gate means to effectively receive said binary feedback signal, providing an output therefrom which is effectively coupled to said register data signal input;

e. state sequence detector means, having an input coupled to said register plural outputs, effective for at least producing a first level signal at an output therefrom for a shift register sequence which comprises a continuum of properly irregular binary states, and a second level signal at said output therefrom for a shift register sequence which comprises a continuum of substantially constant disallowed binary states, said level signals coupled to said control input of said selectable inverter means, whereby said second level signal in conjunction with the said selectable inverter means produces relative inversion of the binary feedback signal.

2. Generator means of claim 1 effective to produce a flickering flame lighting effect, including therefor:
   a. alternating current power source means;
   b. thyristor switch means having input and output means and including effective gate means coupled with said register output means; and,
   c. electric lamp means effectively coupled in a series circuit with at least said power source means and said thyristor switch means.

3. Generator means of claim 2 wherein the frequency of said source of effective clock signal is effectively coupled with said alternating current power source means thereby effective to produce a clock signal frequency that is substantially derived from the power source means intrinsic alternating current frequency.

4. Generator of claim 1 including a source of electric current and whereby said detector means comprises at least a condensor means effectively coupled with and charged by the source of electric current, a discharge means effectively coupled between at least a said register output and an effective juncture coupling the condensor means with the detector means whereby the discharge means produces a state of minimum condensor means effective charge when properly irregular binary states are produced, thereby producing a first level signal from the detector means output; and the discharge means is effectively disabled by any lengthy sequence of disallowed binary states, producing an effective increase of critrical condensor charge thereby producing a second level signal from the detector means output.

5. Generator means of claim 4 whereby said detector means includes resistor means effectively coupled in series with said source of electric current and said condensor means and effective thereby to control charge transfer therebetween, with said first discharge means effectively coupled between the said condensor and the register output to keep the condensor means substantially discharged whenever a properly irregular binary sequence is produced by the generator means, level responsive means coupled to said condensor means effective to produce a first level signal therefrom when the condensor means is substantially discharged and a second level signal therefrom when the condensor means charge increases above a finite value, as during a lengthy sequence of disallowed binary states.

6. Generator means of claim 5 whereby said detector means includes second discharge element means, having an input thereto effective to receive disable control signals and having output means coupled with said condensor means to keep it substantially discharged during a period of sequence interruption produced by the disable control signal.

7. Generator means of claim 1 whereby said detector means comprises at least a binary counter means having a clock input thereto coupled with said source of effective clock signal and which is clocked substantially in parallel with the said shift register, said counter means further including an effective reset input for clearing any binary state advances in the presence of said properly irregular binary states effectively coupled thereto from at least said register output and serving thereby to produce a first level signal from said detector output; and, to allow the unreset clocked binary state advance of the said counter when a lengthy sequence of said disallowed binary states effectively couple thereto, thereby producing a second level signal from said detector output when the counter effectively advances at least one more clock count than there are states "n" in the said shift register means.

8. Generator means of claim 1 whereby said detector means comprises at least a condensor means coupled with and charged by an electric current source, whereby further discharge means coupled with said condensor means effectively inhibits the accumulation of said charge during any period when a signal comprising a continuum of properly irregular binary state changes is produced by the shift register means.

9. Generator means of claim 1 whereby said detector means comprises at least a condensor means effectively coupled with and charged by a source of electric current, whereby further said charging of the condensor means is inhibited by disabling means coupled therewith and responsive to a continuum of substantially constant disallowed binary states coupled from said register means.

10. Generator means of claim 1 including a control input means coupled thereto effective to couple with an ancillary signal source means effective to provide a disable control signal that inhibits the progression of irregular binary state changes therefrom and effectively maintains the relative subsequent state order of the natural pseudorandom sequence character of the irregular pulse train of binary states effectively present at the instant of inhibition.

11. Generator means of claim 10 whereby the said control signal is effectively coupled with said clock signal and thereby synchronized with said clock signal level transistion so the start of any successive binary state changes enabled by the effective removal of the disable control signal from the said control input are substantially time coincident with any effective change in the clock state.

* * * * *